(12) United States Patent
Yu

(10) Patent No.: US 7,999,598 B1
(45) Date of Patent: Aug. 16, 2011

(54) HIGH-VOLTAGE-TOLERANT LINEAR SCALE-DOWN CIRCUIT USING LOW-VOLTAGE DEVICE

(75) Inventor: Tsung-Hsin Yu, Jhudong Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/727,047

(22) Filed: Mar. 18, 2010

(51) Int. Cl.
*H03L 5/00* (2006.01)
(52) U.S. Cl. ............. 327/333; 327/403; 327/99; 326/80
(58) Field of Classification Search .................... 327/99, 327/298, 403–405, 333, 491–492; 326/43–44, 326/80–81, 126, 128
See application file for complete search history.

(56) References Cited

U.S. PATENT DOCUMENTS

| | | | | |
|---|---|---|---|---|
| 5,696,430 A | * | 12/1997 | Erdman et al. | ........... 318/400.34 |
| 7,250,891 B2 | * | 7/2007 | Nishimura | .................... 341/154 |

* cited by examiner

*Primary Examiner* — An T Luu
(74) *Attorney, Agent, or Firm* — Lowe Hauptman Ham & Berner, LLP

(57) ABSTRACT

A voltage scale down circuit includes an input node configured to receive a voltage input within an input voltage range. At least two voltage followers are coupled to the input node. The voltage scale down circuit also includes at least two scalers. Each scaler is coupled to a respective voltage follower. An output node is coupled to the at least two scalers. Each voltage follower is configured to receive the voltage input. Each voltage follower is configured to supply a respective voltage for the voltage input within a narrower portion of the input voltage range. The output node is configured to supply a voltage output linearly related to the voltage input. An output voltage range of the voltage output is narrower than the input voltage range.

20 Claims, 4 Drawing Sheets

HIGH-VOLTAGE-TOLERANT LINEAR SCALE-DOWN CIRCUIT USING LOW-VOLTAGE DEVICE

TECHNICAL FIELD

The present disclosure relates generally to an integrated circuit, more particularly a linear scale down circuit.

BACKGROUND

For an integrated circuit application that has a high-voltage (e.g., 3.3 V) input signal, a high-voltage device is used to deal with the high-voltage input signal. However, for some integrated circuit designs using certain processes, e.g., a 40 nm process, only low-voltage (e.g., 1.8 V) devices are available. If the low-voltage device is used as the input device of a high-voltage application, it will be over-stressed and cause potential unreliability due to the high-voltage input. For example, a voltage $V_{GS}$ across the gate and the source of a low-voltage transistor or a voltage $V_{GD}$ across the gate and the source of the low-voltage transistor is not expected to be over a certain voltage value, e.g., 1.8V. If the $V_{GS}$ or $V_{GD}$ is subject to a voltage over that value, the transistor is over-stressed.

A conventional way to avoid the above over-stress is using a resistor ladder (series resistors) to scale down the input signal from a high-voltage level to a low-voltage level. However, the resistor ladder functions as a current sink and impacts (e.g., lowers) the input impedance for serial link receiver application, e.g., USB1.1.

Accordingly, new mechanisms are desired to solve the above problem.

SUMMARY

In some embodiments, a voltage scale down circuit includes an input node configured to receive a voltage input within an input voltage range. At least two voltage followers are coupled to the input node. The voltage scale down circuit also includes at least two scalers. Each scaler is coupled to a different voltage follower. An output node is coupled to the at least two scalers. Each voltage follower is configured to receive the voltage input. Each voltage follower is configured to supply a respective voltage for the voltage input within a narrower portion of the input voltage range. The output node is configured to supply a voltage output linearly related to the voltage input. An output voltage range of the voltage output is narrower than the input voltage range.

In other embodiments, a method for a voltage scale down circuit includes supplying a voltage input within an input voltage range. The voltage input is received by at least two voltage followers. A respective voltage is provided by each voltage follower for the voltage input within a narrower portion of the input voltage range. The respective voltage is scaled from each voltage follower by at least two scalers. Each scaler is coupled to a different voltage follower. A voltage output is supplied from an output node coupled to all scalers. The voltage output is linearly related to the voltage input. An output voltage range of the voltage output is narrower than the input voltage range.

In yet other embodiments, a voltage scale-down circuit includes an input node configured to receive a voltage input within an input voltage range. At least two source followers are coupled to the input node. The voltage scale-down circuit also includes at least two resistors. Each resistor is coupled to a respective source follower. An output node coupled to the at least two resistors. Each source follower is configured to receive the voltage input. Each source follower provides a respective voltage for the voltage input within a narrower portion of the input voltage range. The output node provides a voltage output linearly related to the voltage input. An output voltage range of the voltage output is narrower than the input voltage range.

These and other embodiments of the present disclosure, as well as its features are described in more detail in conjunction with the text below and attached figures.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
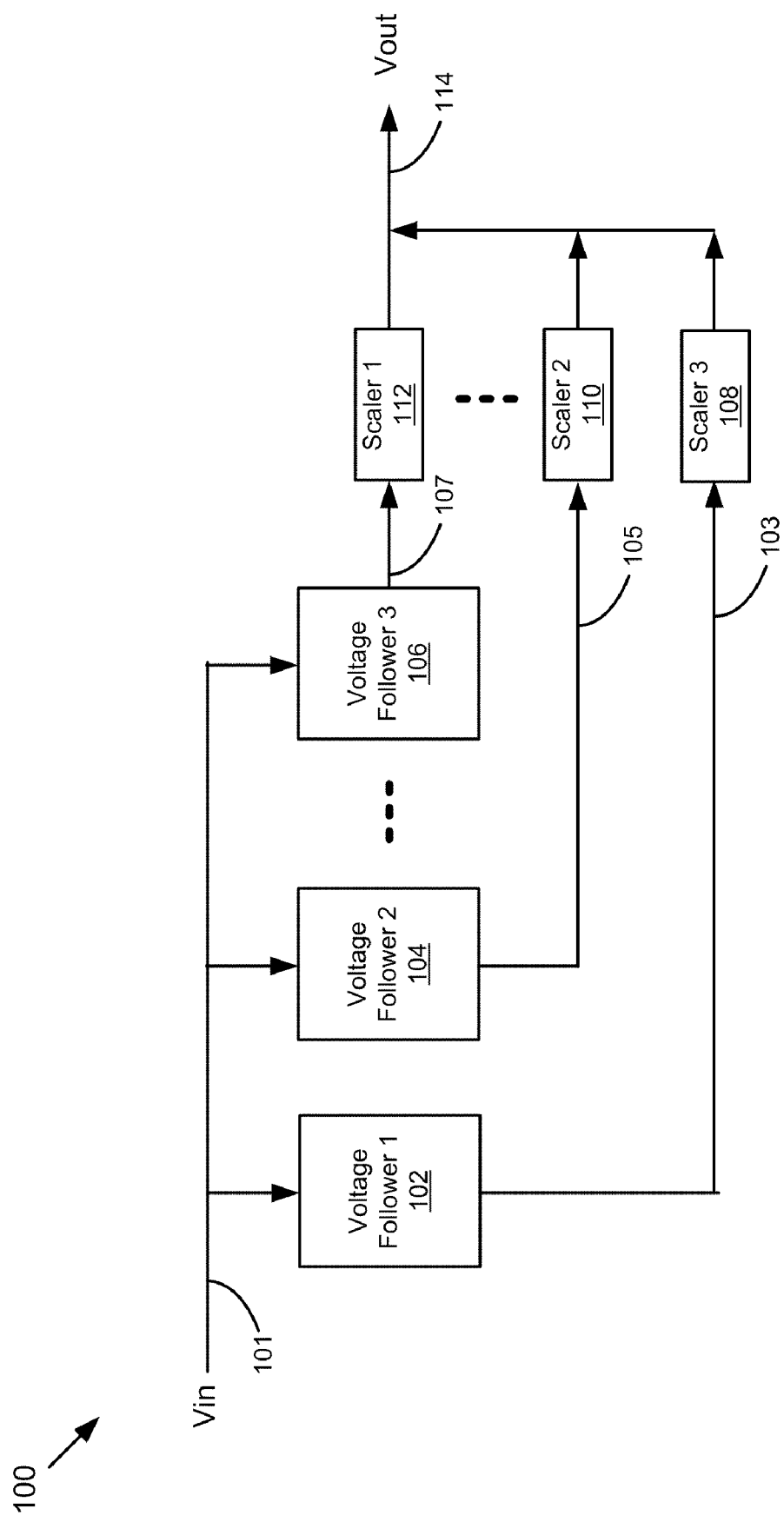
FIG. 1 is a schematic diagram of an exemplary voltage scale-down circuit according to some embodiments.

FIG. 1 is a schematic diagram of an exemplary voltage scale-down circuit according to some embodiments. The scale-down circuit 100 has an input voltage 101, i.e., Vin with a high voltage range (e.g., 0-3.3 V), which is linearly scaled down to an output voltage 114, i.e., Vout that has a low (narrower) voltage range (e.g., 0-1.8 V). "Linear" means that Vout is proportional to Vin, i.e., Vout=k×Vin, where k is a constant less than 1 for scaling-down. In some embodiments, the Vout is shifted by a specified value, e.g., by 0.6 V, to have a range of 0.6 V-2.4 V instead of 0 V-1.8 V. In this case, Vout=k×Vin+Vshift, where Vshift is the specified shifting voltage value, and Vout is still linearly related to Vin.

The Vin is received by multiple voltage follower circuits, e.g., 102, 104, and 106, that are coupled together through respective scalers, e.g., 108, 110, and 112 to have the common voltage output Vout 114. Each voltage follower 102, 104, and 106 tracks Vin for a narrower voltage range (e.g., 0-1.8 V) than Vin (e.g., 0-3.3 V). In embodiments, the number of voltage followers can be any number greater than 1. In some embodiments, the voltage followers are implemented by source followers.

In one example, the voltage follower 102 tracks Vin for a voltage range from 0 V to 1.8 V. Therefore, the voltage follower can use devices designed for low voltage range (e.g., 1.8 V) instead of high voltage range (e.g., 3.3 V). Each voltage follower can have a voltage clamp circuit to keep its operating voltage at a certain level for Vin that is outside each voltage follower's respective voltage range, and avoid stressing the low voltage range devices in the voltage follower from Vin with a high voltage range. For example, for Vin from 0 V to 1.8 V, the voltage follower tracks Vin. For Vin from 1.8 V to 3.3V, a voltage clamp circuit keeps its output voltage at 1.8 V.

Also, each voltage follower can have an output voltage that is shifted from Vin for a specified positive or negative voltage level. For example, each voltage follower can provide Vout as Vin plus a specified voltage (e.g., Vin+0.6 V). In another example, each voltage follower can provide Vout as Vin minus a specified voltage (e.g., Vin−0.6 V).

Each scaler 108, 110, and 112, coupled to the voltage followers 102, 104, and 106 respectively, scales the voltage value from each voltage followers, so that the combined Vout linearly scales down Vin, i.e., Vout is proportional to Vin (with voltage shift in some embodiments). In some embodiments, the scalers are implemented as resistors. Further details of implementation and operation of the circuit 100 is described below. The voltage scale down circuit 100 using low-voltage devices to linearly scale down a high-voltage input signal can be used for high sensitivity and low distortion applications because the linearity reduces distortion and improves the output sensitivity to the input, such as differential OPAMP or serial link receiver (e.g., USB 1.1).

Figure 2:
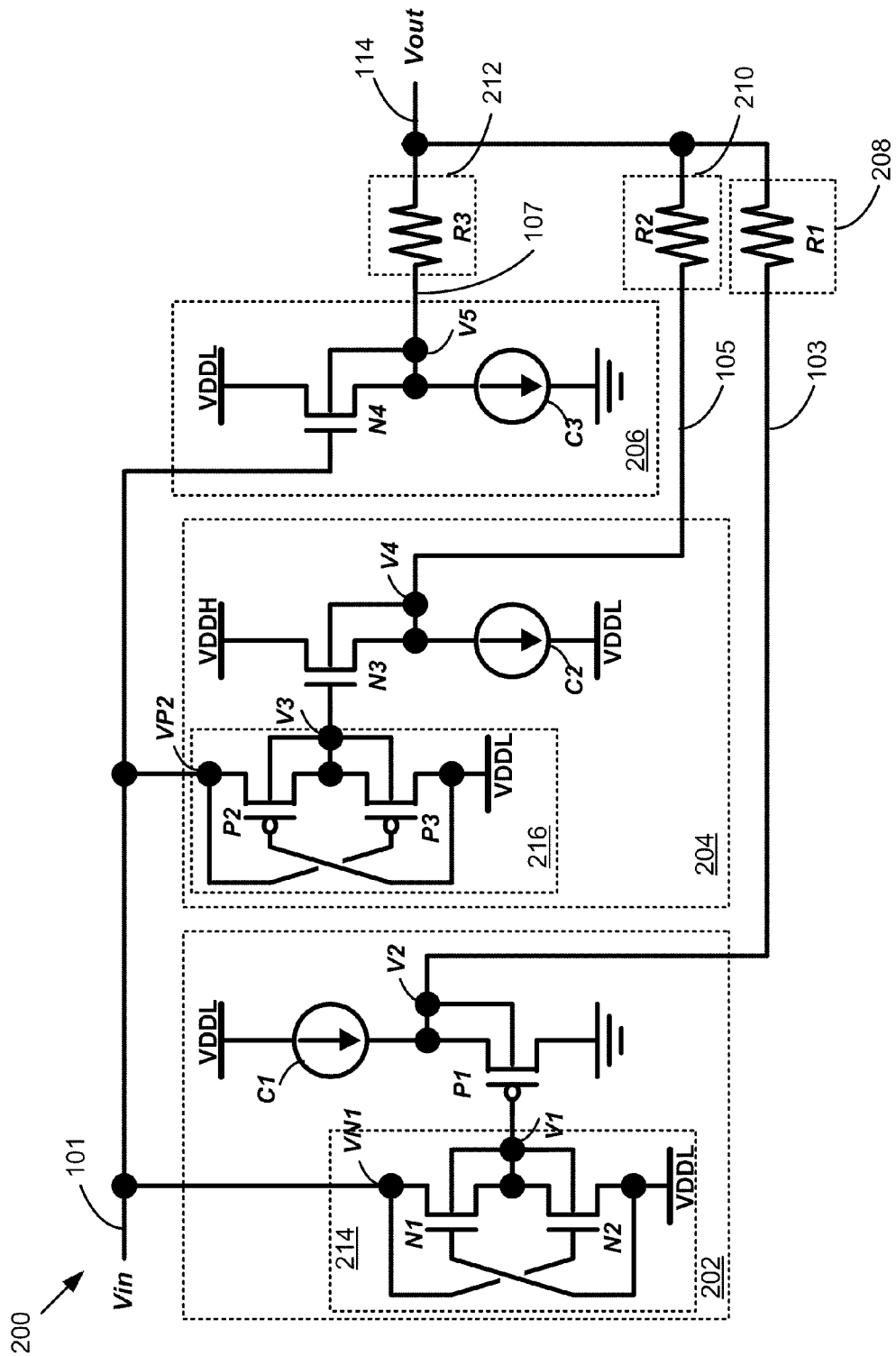
FIG. 2 is one exemplary embodiment of the voltage scale-down circuit shown in FIG. 1.

FIG. 2 is one exemplary embodiment of the voltage scale-down circuit shown in FIG. 1. The voltage followers 202, 204, and 206 correspond to the voltage followers 102, 104, 106 shown in FIG. 1. The scalers 208, 210, and 212 correspond to the scalers 108, 110, and 112 shown in FIG. 1. The voltage follower 202 is a low-voltage-region P-type source follower and includes a voltage clamp circuit 214. The voltage follower 204 is a high-voltage-region N-type source follower and includes a voltage clamp circuit 216. The voltage follower 206 is a low-voltage-region N-type source follower. The three voltage followers 202, 204, and 206 are coupled together to generate the Vout 114 through respective resistors 208, 210, and 212. The resistors 208, 210, and 212 scale the voltage value from each voltage follower, 202, 204, and 206 respectively, so that the combined Vout can linearly (i.e., proportionally) scales down Vin. The values of resistors 208, 210, and 212 and the ratios among them depend on each implementation.

The voltage follower 202, i.e., the low-voltage-region P-type source follower 202, tracks Vin for a voltage range from 0 V to VDDL, e.g., 1.8 V, which is reflected at V1. NMOS transistors N1 and N2 form a voltage clamp circuit 214 to limit V1 to VDDL, e.g., 1.8 V, which protects a PMOS transistor P1 against over-stress from high voltage in embodiments where P1 is designed for a low voltage operation, e.g., 1.8 V.

When Vin is lower than VDDL, N1 is turned on because its gate voltage that is coupled to VDDL is higher than its source voltage VN1 that is coupled to Vin, and N2 is turned off because its gate voltage that is coupled to Vin is lower than its source voltage VDDL. Therefore, V1 tracks Vin through N1. Also, P1 is turned on for Vin lower than VDDL, because its source is coupled to VDDL through a current source C1. With P1 turned on, the voltage at V2 tracks the voltage at V1 through P1, and has a shifted voltage value of (V1+Vtp) up to VDDL, where Vtp is the threshold voltage of P1. The current source C1 is known in the art and can be implemented in various ways, e.g., using a PMOS current source or using a resistor, etc.

When Vin is higher than VDDL, N1 is turned off because its gate voltage VDDL is lower than its source voltage VN1 that is coupled to Vin, and N2 is turned on because its gate voltage from VN1 is higher than its source voltage coupled to VDDL. Therefore, V1 is fixed at VDDL through N2. Also, because the gate voltage of P1, i.e., V1=VDDL, is higher than the source voltage of P1 at V2 that is coupled to VDDL through the current source C1, P1 is turned off. When P1 is turned off, the voltage at V2 remains at VDDL.

The voltage follower 204, i.e., the high-voltage-region N-type source follower 204, tracks Vin for a voltage range from VDDL, e.g., 1.8 V, to VDDH, e.g., 3.3 V, which is reflected at V3. PMOS transistors P2 and P3 form a voltage clamp circuit 216 to limit V3 from VDDL, e.g., 1.8 V to VDDH, e.g., 3.3 V, which protects an NMOS transistor N3 against over-stress from high voltage on $V_{GS}$ or $V_{GA}$ in embodiments where N3 is designed for a low voltage operation, e.g., 1.8 V.

When Vin is higher than VDDL, P2 is turned on because its gate voltage that is coupled to VDDL is lower than its source voltage VP2 that is coupled to Vin, and P3 is turned off because its gate voltage that is coupled to VP2 is higher than its source voltage that is coupled to VDDL. Therefore, V3 tracks Vin through P2. Also, N3 is turned on for Vin higher than VDDL, because its source is coupled to VDDL through a current source C2. With N3 turned on, the voltage at V4 tracks the voltage at V3 through N3, and has a shifted voltage value of (V3−Vtn1) down to VDDL, where Vtn1 is the threshold voltage of N3.

When Vin is lower than VDDL, P3 is turned on because its gate voltage that is coupled to Vin is lower than its source voltage VDDL, and P2 is turned off because its gate voltage that is coupled to VDDL is higher than its source voltage that is coupled to Vin. Therefore, V3 is fixed at VDDL through P3. Also, because the gate voltage of N3, i.e., V3=VDDL, is lower than the source voltage of N3 that is coupled to VDDL through the current source C2, N3 is turned off. With N3 turned off, the voltage at V4 remains VDDL. The current source C2 is known in the art and can be implemented in various ways, e.g., using an NMOS current source or using a resistor, etc.

The voltage follower 206, i.e., the low-voltage-region N-type source follower 206 tracks Vin for a voltage range from GND, i.e., 0 V, to VDDL, e.g., 1.8 V, where the output voltage at V5 is Vtn2 (i.e., a threshold voltage of an NMOS transistor N4) lower than Vin.

When Vin is higher than Vtn2, N4 is turned on because its gate voltage that is coupled to Vin that is higher than its source voltage coupled through a current source C3 to ground (GND). Therefore, V5 tracks Vin through N4, and has a shifted voltage value of (Vin−Vtn2) from GND to VDDL, where Vtn2 is the threshold voltage of N4. When Vin is higher than VDDL, N4 is still turned on, but V5 remains at VDDL because V5 is limited by VDDL that is coupled to the drain of N4. The current source C3 is known in the art and can be implemented in various ways, e.g., using an NMOS current source or using a resistor, etc.

Finally, the outputs of the source followers 202, 204, and 206 are coupled together through individual resistors 208, 210, and 212 to generate the output signal Vout. Each resistor scales the voltage value from each source follower so that Vout is a linearly scaled down version of Vin.

Figure 3B:
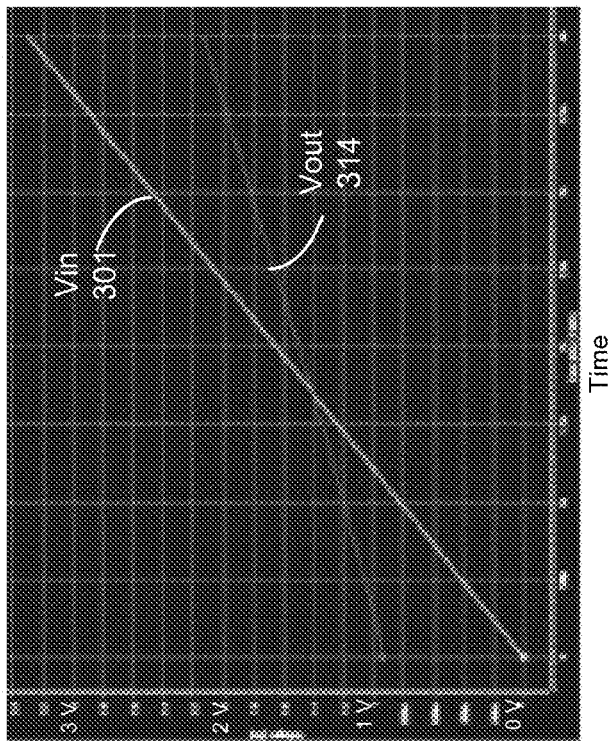
FIG. 3B is another plot showing waveforms of the circuit shown in FIG. 2.
Figure 3A:
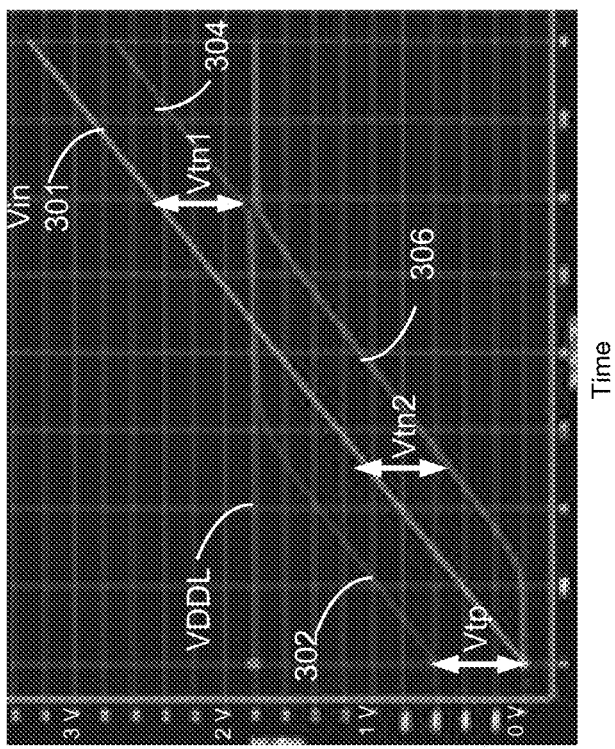
FIG. 3A is a plot showing waveforms of the circuit shown in FIG. 2.

FIG. 3A is a plot showing waveforms of the circuit shown in FIG. 2. The waveform 302 shows a plot of V2 for one embodiment with VDDL=1.8 V, VDDH=3.3 V, and Vtp=0.6 V, as Vin 301 changes from 0 V to 3.3 V (VDDH). As shown, V2 302 tracks Vin 301 and has a voltage value of (Vin+Vtp) up to VDDL. The waveform 304 shows a plot of V4 for one embodiment with VDDL=1.8 V, VDDH=3.3 V, and Vtn1=0.6 V, as Vin 301 changes from 0 V to 3.3 V (VDDH). As shown, V4 304 tracks Vin 301 and has a voltage value of (Vin−Vtn1) down to VDDL. The waveform 306 shows a plot of V5 for one embodiment with VDDL=1.8 V, VDDH=3.3 V, and Vtn2=0.6 V, as Vin 301 changes from 0 V to 3.3 V (VDDH). As shown, V5 306 tracks Vin 301 and has a voltage value of (Vin−Vtn2) from GND to VDDL.

The waveform 314 in FIG. 3B shows a plot of Vout as Vin 301 is swept from 0 V to 3.3 V (VDDH). Vout 314 has the same trend as Vin 301, but has reduced voltage swing range. More specifically, Vout waveform 314 is shown with voltage values about 0.95 V-2.15 V, having about 1.2 V range, compared to Vin having about 3.3 V range (0 V-3.3 V). In FIG. 3B, the Vin 301 is not only scaled down to Vout 314 (i.e., from 3.3 V range to 1.2 V range), but is also shifted from ground, i.e., 0 V, to a mid-level voltage, e.g., 0.95 V. This shifted signal Vout is better suited for some applications, e.g., an OPAMP stage design that is coupled to Vout, because of reduced design complexity. In embodiments, Vout can be shifted to a desired voltage level.

In summary, the circuit 200 linearly scaled down the high voltage input Vin. The circuit 200 is high-voltage-tolerant and avoids device over-stress while using low-voltage devices. Also, the circuit 200 has a high input-impedance by using source followers. Some embodiments having high input impedance avoid impact on input signal quality that may happen with low input impedance circuit. Some embodiments having high-linearity scale-down result in high sensitivity to input change.

Figure 4:
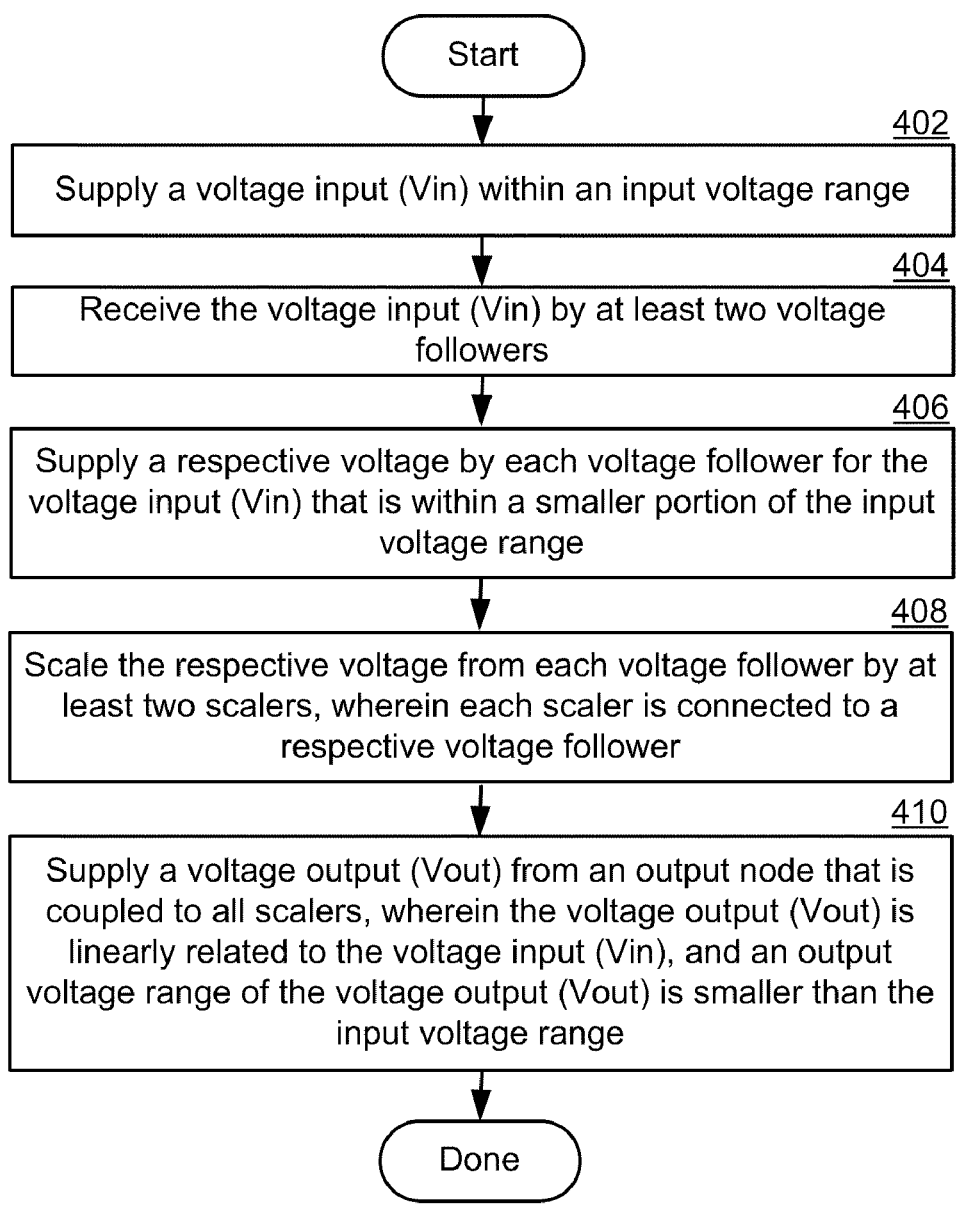
FIG. 4 is a flowchart showing a method for a voltage scale-down circuit shown in FIG. 1 according to some embodiments.

FIG. 4 is a flowchart showing a method for a voltage scale-down circuit shown in FIG. 1 according to some embodiments. At step 402, a voltage input Vin is supplied within an input voltage range, e.g., 0-3.3 V. At step 404, the voltage input Vin is received by at least two voltage followers. At step 406, a respective voltage is supplied by each voltage follower for the voltage input Vin (e.g., Vtp to VDDL for 302, VDDL to VDDH-Vtn1 for 304, and 0 V to VDDL for 306) within a narrower portion of the input voltage range, e.g., 0 V-1.8 V. At step 408, the respective voltage from each voltage follower is scaled by at least two scalers, wherein each scaler is coupled to a respective voltage follower. At step 410, a voltage output Vout is supplied from an output node that is coupled to all scalers, wherein the voltage output Vout is linearly related to the voltage input Vin, and an output voltage range of the voltage output Vout is narrower than the input voltage range. In some embodiments, a clamped voltage is provided by at least one of the at least two voltage followers, for the voltage input Vin that is outside the narrower portion, e.g., 1.8 V, of the input voltage range.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The above method embodiment shows exemplary steps, but they are not necessarily required to be performed in the order shown. Steps may be added, replaced, changed order, and/or eliminated as appropriate, in accordance with the spirit and scope of embodiment of the disclosure.

Each claim of this document constitutes a separate embodiment, and embodiments that combine different claims and/or different embodiments are within scope of the disclosure and will be apparent to those skilled in the art after reviewing this disclosure. Accordingly, the scope of the disclosure should be determined with reference to the following claims, along with the full scope of equivalences to which such claims are entitled.

What is claimed is:

1. A voltage scale-down circuit, comprising:
   an input node configured to receive a voltage input within an input voltage range;
   at least two voltage followers coupled to the input node;
   at least two scalers, each scaler coupled to a respective voltage follower of the at least two voltage followers; and
   an output node coupled to the at least two scalers,
   wherein each voltage follower is configured to receive the voltage input and supply a respective voltage for the voltage input within a narrower portion of the input voltage range, and the output node is configured to supply a voltage output linearly related to the voltage input, and an output voltage range of the voltage output is narrower than the input voltage range.

2. The circuit of claim 1, wherein at least one of the at least two voltage followers has a voltage clamp for the voltage input that is outside the narrower portion of the input voltage range corresponding to the at least one of the at least two voltage followers.

3. The circuit of claim 1, wherein the at least two voltage followers are source followers.

4. The circuit of claim 1, wherein the at least two scalers are resistors.

5. The circuit of claim 1, wherein a first voltage follower of the at least two voltage followers is a P-type source follower providing the respective voltage for the voltage input within a first voltage region of the input voltage range.

6. The circuit of claim 5, wherein the first voltage follower has a voltage clamp for the voltage input outside the first voltage region of the input voltage range.

7. The circuit of claim 1, wherein a second voltage follower of the at least two voltage followers is an N-type source follower providing the respective voltage for the voltage input within a second voltage region of the input voltage range.

8. The circuit of claim 7, wherein the second voltage follower has a voltage clamp for the voltage input outside the second voltage region of the input voltage range.

9. The circuit of claim 1, wherein a third voltage follower of the at least two voltage followers is an N-type source follower providing the respective voltage for the voltage input within a third voltage region of the input voltage range.

10. A method for a voltage scale down circuit, comprising:
    supplying a voltage input within an input voltage range;
    receiving the voltage input by at least two voltage followers;
    supplying a respective voltage by each voltage follower for the voltage input that is within a narrower portion of the input voltage range;
    scaling the respective voltage from each voltage follower by a respective scaler, wherein a scaler is coupled to a respective voltage follower; and
    supplying a voltage output from an output node coupled to the at least two scalers, wherein the voltage output is linearly related to the voltage input, and an output voltage range of the voltage output is narrower than the input voltage range.

11. The method claim 10, further comprising providing a clamped voltage by at least one of the at least two voltage followers for the voltage input that is outside the narrower portion of the input voltage range corresponding to the at least one of the at least two voltage followers.

12. The method of claim 10, wherein the voltage followers are source followers.

13. The method of claim 10, wherein the scalers are resistors.

14. The method of claim 10, wherein a first voltage follower of the at least two voltage followers is a P-type source follower providing the respective voltage for the voltage input within a first voltage region of the input voltage range.

15. The method of claim 14, wherein the first voltage follower has a voltage clamp for the voltage input outside the first voltage region of the input voltage range.

16. The method of claim 10, wherein a second voltage follower of the at least two voltage followers is an N-type source follower providing the respective voltage for the voltage input within a second voltage region of the input voltage range.

17. The method of claim 16, wherein the second voltage follower has a voltage clamp for the voltage input outside the second voltage region of the input voltage range.

18. The method of claim 10, wherein a third voltage follower of the at least two voltage followers is an N-type source follower providing the respective voltage for the voltage input within a third voltage region of the input voltage range.

19. A voltage scale-down circuit, comprising:
    an input node configured to receive a voltage input within an input voltage range;
    at least two source followers coupled to the input node;
    at least two resistors, each resistor coupled to a respective source follower; and
    an output node coupled to the at least two resistors,
    wherein each source follower is configured to receive the voltage input and supply a respective voltage for the voltage input within a narrower portion of the input voltage range, and the output node is configured to provide a voltage output linearly related to the voltage input, and an output voltage range of the voltage output is narrower than the input voltage range.

20. The circuit of claim 19, wherein one of the at least two source followers has a voltage clamp for the voltage input that is outside the narrower portion of the input voltage range.

* * * * *